United States Patent
Mao et al.

(10) Patent No.: US 7,732,009 B2
(45) Date of Patent: Jun. 8, 2010

(54) METHOD OF CLEANING REACTION CHAMBER, METHOD OF FORMING PROTECTION FILM AND PROTECTION WAFER

(75) Inventors: Chih-Jen Mao, Tainan County (TW); Chun-Hung Hsia, Taipei County (TW); Ta-Ching Yang, Changhua County (TW); Chun-Cheng Yu, Tainan (TW); Chien-Fu Chu, Hsinchu (TW); Kuo-Wei Yang, Hsinchu (TW); Chun-Han Chuang, Hsinchu (TW); Hui-Shen Shih, Changhua Hsien (TW)

(73) Assignee: United Microelectronics Corp., Hsinchu (TW)

( * ) Notice: Subject to any disclaimer, the term of this patent is extended or adjusted under 35 U.S.C. 154(b) by 488 days.

(21) Appl. No.: 11/535,072

(22) Filed: Sep. 26, 2006

(65) Prior Publication Data

US 2008/0075852 A1   Mar. 27, 2008

(51) Int. Cl.
  *C23C 16/00* (2006.01)
  *B08B 9/00* (2006.01)
  *B05D 7/22* (2006.01)

(52) U.S. Cl. .............. 427/230; 427/248.1; 134/22.1
(58) Field of Classification Search ............ None
  See application file for complete search history.

(56) References Cited

U.S. PATENT DOCUMENTS

| 5,589,003 A * | 12/1996 | Zhao et al. ............ 118/728 |
| 6,828,241 B2 | 12/2004 | Kholodenko et al. |
| 2001/0046768 A1* | 11/2001 | Mezey, Sr. ............ 438/680 |
| 2003/0029563 A1* | 2/2003 | Kaushal et al. ......... 156/345.1 |
| 2003/0180459 A1* | 9/2003 | Redeker et al. ......... 427/248.1 |
| 2005/0214455 A1 | 9/2005 | Li et al. |
| 2006/0130758 A1* | 6/2006 | Lohokare et al. ........ 118/715 |

FOREIGN PATENT DOCUMENTS

JP   2004247404   9/2004

* cited by examiner

*Primary Examiner*—Timothy H Meeks
*Assistant Examiner*—Joseph Miller, Jr.
(74) *Attorney, Agent, or Firm*—Jianq Chyun IP Office

(57) ABSTRACT

A method of cleaning a reaction chamber having a wafer holder is provided. First, the reaction chamber is cleaned by a cleaning gas. Next, a protection film is formed on the inner surface of the reaction chamber, wherein a gap is formed between the protection wafer and the wafer holder, and a cooling gas is guided therebetween simultaneously.

15 Claims, 2 Drawing Sheets

//]: #

METHOD OF CLEANING REACTION CHAMBER, METHOD OF FORMING PROTECTION FILM AND PROTECTION WAFER

BACKGROUND OF THE INVENTION

1. Field of the Invention

The present invention generally relates to a method of cleaning a semiconductor equipment, and more particularly, to a method of cleaning a reaction chamber.

2. Description of Related Art

In the semiconductor fabrication process, the inner surface of the reaction chamber of the semiconductor equipment would be contaminated after a period of operation, namely a deposition or an etching process. If the reaction chamber is not cleaned, the wafer processed within the reaction chamber would be contaminated. Thus, the fabrication yield is substantially reduced. Therefore, it is critical that the reaction chamber must be cleaned regularly.

Currently, the conventional method of cleaning the reaction chamber comprises two steps. First, a plasma gas containing $NF_3$ gas is used to clean the contamination on the inner surface of the reaction chamber. Next, a protection film made of oxide is formed on the inner surface of the reaction chamber.

However, the protection film would also be formed simultaneously on an electrostatic chuck (E-chuck), which is adopted for carrying the wafers. The protection film formed on the E-chuck would stick on the back side of the wafer, and may peel off during the subsequent process and cause contamination. Accordingly, this may lower the fabrication yield rate and fabrication throughput.

In the prior art, a method for preventing the protection film from depositing on the E-chuck is to cover a ceramic wafer on the E-chuck. However, the ceramic wafer may break due to overheat conditions when depositing the protection film. In order to resolve the above problem, helium gas was guided into the E-chuck and exhausted through outlets of the E-chuck for reducing the temperature of the ceramic wafer. However, the helium gas exhausted from the outlets would cause uneven stress of the ceramic wafer and becomes tilted, and one end of the ceramic wafer may contact the E-chuck. Furthermore, abnormal black powders may be generated on the E-chuck due to the high temperature condition where the E-chuck comes in contact with the ceramic wafer causing wear and tear of the E-chuck.

SUMMARY OF THE INVENTION

Accordingly, one purpose of the present invention is to provide a method of cleaning a reaction chamber, wherein the possibility of the protection film sticking on the back side of a treated wafer may be effectively reduced.

A second purpose of the present invention is to provide a protection wafer, wherein the possibility of the protection film depositing on the wafer holder can be effectively reduced.

A third purpose of the present invention is to provide a method of forming a protection film, wherein the possibility of formation of the protection film on the wafer holder can be effectively reduced.

As embodied and broadly described herein, the present invention provides a method of cleaning a reaction chamber. The reaction chamber has a wafer holder. The method comprises the following steps. First, the reaction chamber is cleaned by a cleaning gas. Next, a protection film is formed on an inner surface of the reaction chamber, wherein when forming the protection film, a protection wafer is provided above the wafer holder such that a gap is formed between the protection wafer and the wafer holder, and a cooling gas is guided between the protection wafer and the wafer holder simultaneously.

According to an embodiment of the present invention, the method of forming the gap between the protection wafer and the wafer holder includes providing a plurality of supporting pins on the wafer holder to support the protection wafer.

According to an embodiment of the present invention, the cooling gas is provided by the wafer holder.

According to an embodiment of the present invention, the cooling gas comprises helium gas.

According to an embodiment of the present invention, the wafer holder is an electrostatic chuck.

According to an embodiment of the present invention, a material of the wafer holder comprises ceramic material.

According to an embodiment of the present invention, a material of the protection wafer comprises ceramic material.

According to an embodiment of the present invention, the protection wafer comprises a first covering body for covering a supporting surface of the wafer holder.

According to an embodiment of the present invention, the first covering body comprises a circular plate.

According to an embodiment of the present invention, the protection wafer further comprises a second covering body connected to a periphery of the first covering body for covering a lateral surface connected to the periphery of the supporting surface.

According to an embodiment of the present invention, the second covering body comprises a ring-shape side wall.

According to an embodiment of the present invention, a material of the protection film comprises oxide.

According to an embodiment of the present invention, the method of forming the protection film comprises performing a chemical vapor deposition process.

According to an embodiment of the present invention, the cleaning gas comprises NF3.

According to an embodiment of the present invention, the reaction chamber comprises a chemical vapor deposition chamber.

According to an embodiment of the present invention, the reaction chamber comprises a dry etching chamber.

As embodied and broadly described herein, the present invention also provides a protection wafer suitable for a cleaning process for cleaning a reaction chamber. The reaction chamber has a wafer holder, and the wafer holder comprises a supporting surface and a lateral surface connected to a periphery of the supporting surface. The protection wafer comprises a first covering body and a second covering body. The first covering body is adapted for covering the supporting surface of the wafer holder. The second covering body is connected to a periphery of the first covering body, to cover the lateral surface connected to the periphery of the supporting surface.

According to an embodiment of the present invention, the first covering body comprises a circular plate.

According to an embodiment of the present invention, the second covering body comprises a ring-shape side wall.

According to an embodiment of the present invention, a material of the protection wafer comprises ceramic material.

As embodied and broadly described herein, the present invention also provides a method of forming a protection film on an inner surface of a reaction chamber. The reaction chamber has a wafer holder. The method comprises the following steps. First, a protection wafer is provided above the wafer holder when forming the protection film such that a gap is formed between the protection wafer and the wafer holder, and a cooling gas is guided between the protection wafer and the wafer holder simultaneously.

In the present invention, a protection wafer is provided above the wafer holder when forming the protection film such that a gap is formed between the protection wafer and the wafer holder, and the cooling gas is guided between the protection wafer and the wafer holder to form an air curtain. This method may also reduce the possibility of the protection film from forming on the wafer holder, and the condition that the protection film sticks on the back of the wafer may not occur. Accordingly, this may reduce the possibility of the protection film from sticking on the back side of the wafer from peeling off in the subsequent processes causing contamination of the chamber. Thus, to the fabrication yield and the fabrication throughput may be effectively promoted.

Besides, since a gap is formed between the protection wafer and the wafer holder, the protection wafer would not come in direct contact with the wafer holder. Therefore, this may prevent the formation of abnormal black powder on the wafer holder. Thus, the service life time of the wafer holder may be effectively promoted. In addition, since the cooling gas is guided between the protection wafer and the wafer holder, the possibility of the protection wafer from breaking due to overheat conditions may be effectively avoided.

Furthermore, the protection wafer of the present invention may efficiently cover the supporting surface and the lateral surface of the wafer holder, and thereby reduce the possibility of formation of the protection film on the wafer holder.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
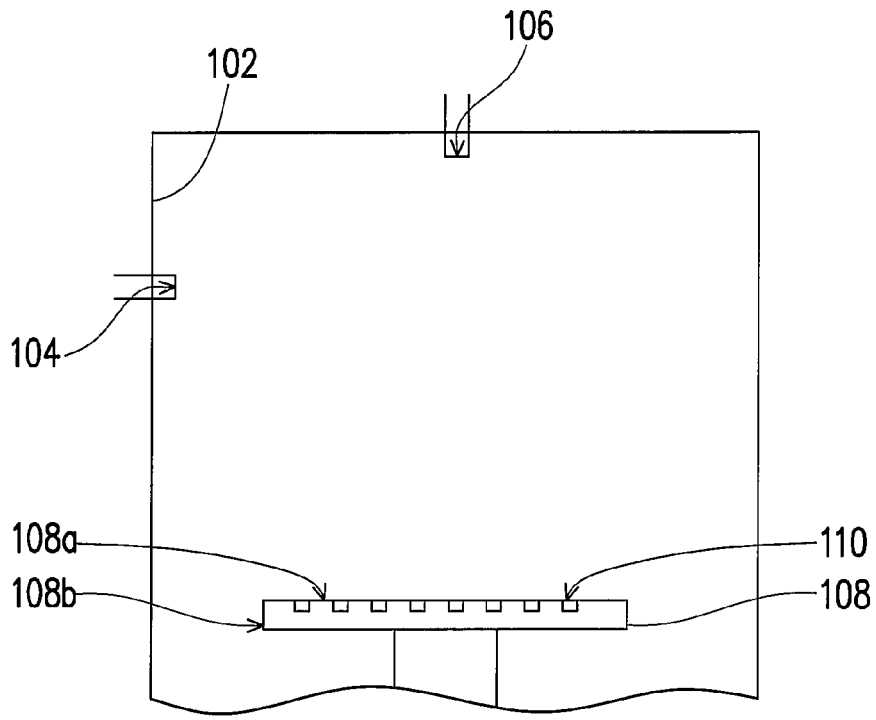
FIGS. 1A and 1B are schematic cross-sectional views showing the process steps of a method of cleaning a reaction chamber according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
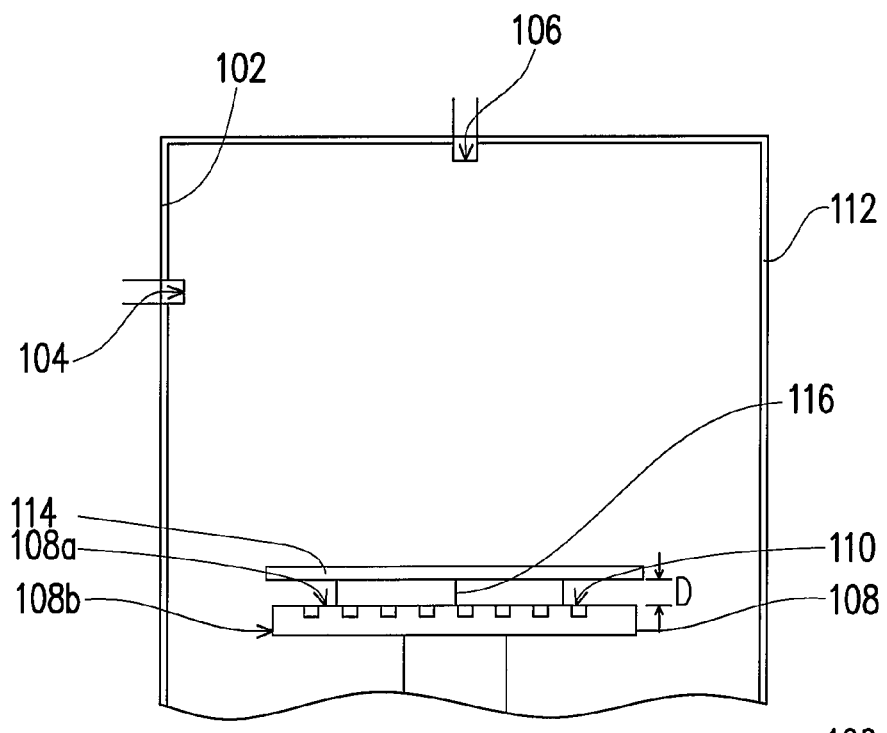
Figure 2:
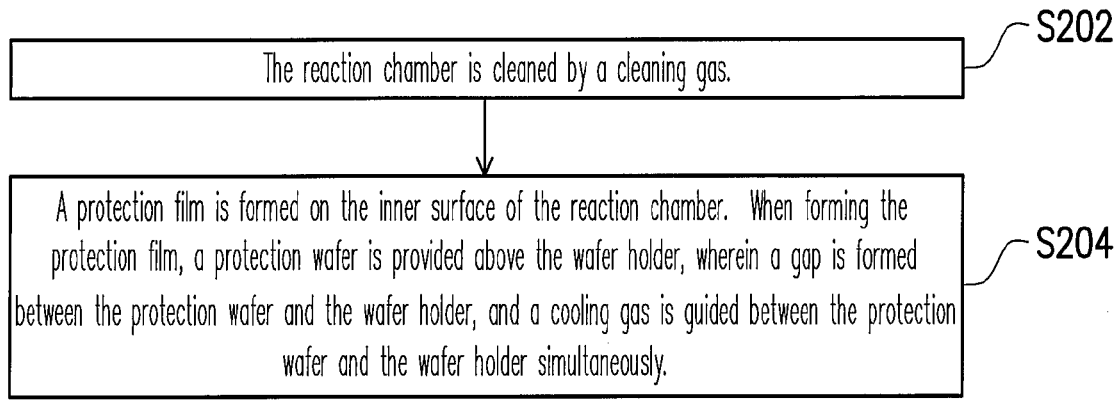
FIG. 2 is a flow chart illustrating a method of cleaning a reaction chamber according to an embodiment of the present invention.

FIGS. 1A and 1B are schematic cross-sectional views showing the process steps of a method of cleaning a reaction chamber according to an embodiment of the present invention. FIG. 2 is a flow chart illustrating a method of cleaning a reaction chamber according to an embodiment of the present invention.

First, referring to FIG. 1A, a reaction chamber 100 of the present invention has an inner surface 102. An inlet 104 for guiding a cleaning gas is arranged on a lateral surface of the reaction chamber 100, and another inlet 106 for guiding a reaction gas is arranged on a top surface of the reaction chamber 100. The reaction chamber 100 may be a chemical vapor deposition chamber or a dry etching chamber. A wafer holder 108 is arranged in the reaction chamber 100; the wafer holder 108 has a supporting surface 108a and a lateral surface 108b connected to a periphery of the supporting surface 108a; the wafer holder 108 has outlets 110 for exhausting the cooling gas. The wafer holder 108 may comprise ceramic material. It should be noted that the reaction chamber 100 as shown in FIG. 1 is only an embodiment of the present invention; however, the present invention is not limited to the embodiment described herein.

The method of cleaning the reaction chamber of the present invention is illustrated as follows. First, referring to FIGS. 1A and 2, the method of cleaning the reaction chamber comprises a step S202 and a step S204. In the step S202, the reaction chamber 100 is cleaned by a cleaning gas, wherein the cleaning gas may contain $NF_3$ gas, and may be charged into the reaction chamber 110 through the inlet 104 to clean the pollution sticking on the inner surface 102 of the reaction chamber 100.

Next, referring to FIGS. 1B and 2, in the step S204, a protection film 112 is formed on the inner surface 102 of the reaction chamber 100, wherein the protection film 112 may be oxide, and the method of forming the protection film 112 may comprise performing a chemical vapor deposition process.

When forming the protection film 112, a protection wafer 114 is provided above the wafer holder 108 such a gap with a width D may be formed between the protection wafer 114 and the wafer holder 108. Simultaneously, a cooling gas is guided between the protection wafer 114 and the wafer holder 108. Wherein, a plurality of supporting pins 116 is provided on the wafer holder 108 to support the protection wafer 114 prior to disposing the protection wafer 114 on the wafer holder 108 so that the gap with the width D is formed between the protection wafer 114. As shown in FIG. 1B, three supporting pins 116 are disposed on the wafer holder 108, however the number of the supporting pins 116 is not limited in the present invention. The number of the supporting pins 116 can be adjusted according to different situations and requirements.

Besides, it may be better that the width D between the protection wafer 114 and the wafer holder 108 is short enough to avoid the protection wafer 114 from coming in direct contact with the wafer holder 108. The cooling gas guided between the protection wafer 114 and the wafer holder 108 may comprise helium gas provided by the outlets 110 of the wafer holder 108. The protection wafer 114 may be a circular plate, and the protection wafer 114 may comprise ceramic material.

In the above-mentioned method of cleaning the reaction chamber 100, when forming the protection film 112 on the inner surface 102 of the reaction chamber 100 (step S204), a gap with a width D may be formed between the protection wafer 114 and the wafer holder 108, and the cooling gas is guided between the protection wafer 114 and the wafer holder 108 forms an air curtain. Thus, the possibility of the reaction gas used for forming the protection film 112 from entering between the protection wafer 114 and the wafer holder 108 may be effectively reduced. Accordingly, this may avoid the protection film 112 from forming on the supporting surface 108a of the wafer holder 108. Therefore, the possibility of the protection film 112 from sticking on the back side of the wafer may be effectively reduced. Hence, this may reduce the possibility of the protection film from sticking on the back side of the wafer which would otherwise cause contamination of the chamber. Accordingly, both the fabrication yield rate and the fabrication throughput may be promoted.

In addition, since the gap with the width D is formed between the protection wafer 114 and the wafer holder 108, the protection wafer 114 would not come in direct contact with the wafer holder 108. Accordingly, the possibility of the formation of the abnormal black powder on the wafer holder 108 may be effectively reduced, thus increasing the service life of the wafer holder 108 may be effectively promoted.

Furthermore, the cooling gas is guided between the protection wafer 114 and the wafer holder 108 so that the possibility of the protection wafer 114 from breaking due to overheat conditions when forming the protection film 112 may be effectively reduced.

The protection wafer of the present invention is illustrated as follows. The structure of the protection wafer is different from the protection wafer 114 disclosed in the above embodiment, which is used to reduce the possibility of the protection film 112 from forming on the supporting surface 108a of the wafer holder 108.

Figure 3:
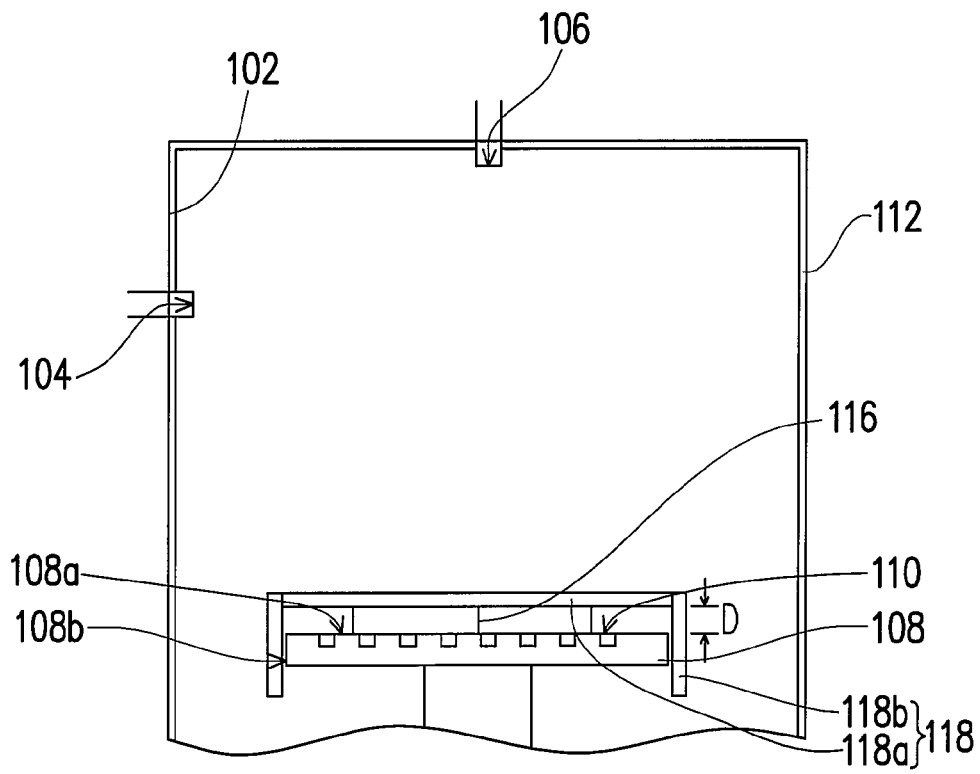
FIG. 3 is a schematic cross-sectional view showing a reaction chamber according to another embodiment of the present invention.

FIG. 3 is a schematic cross-sectional view showing a reaction chamber according to another embodiment of the present invention. The structure of the reaction chamber 100 shown in FIG. 3 is similar to that shown in FIGS. 1A and 1B except for the protection wafer 118.

Referring to FIG. 3, the protection wafer 118 of the present invention comprises a first covering body 118a and a second covering body 118b. The protection wafer 118 may comprise ceramic material.

The first covering body 118a is adapted for covering the supporting surface 108a of the wafer holder 108, and may be a circular plate.

The second covering body 118b is connected to a periphery of the first covering body 118a to cover the lateral surface 108b connected to the periphery of the supporting surface 108a. The second covering body 118b may be a ring-shape side wall.

In this embodiment, the protection wafer 118 may cover the supporting surface 108a and the lateral surface 108b of the wafer holder 108, and therefore this would extend the transmission pathway of the reaction gas entering between the protection wafer 114 and the wafer holder 108. Accordingly, the present invention has a better capability of preventing the protection film 112 from forming on the wafer holder 108.

In summary, the present invention has at least the following advantages:

1. The method of forming the protection film of the present invention may reduce the possibility of the protection film from sticking on the back side of the wafer.

2. The method of cleaning the reaction chamber disclosed in the present invention may reduce the possibility of the protection film sticking on the back side of the wafer which may otherwise peel off during the subsequent processes causing contamination of the chamber. Thus, both the fabrication yield rate and the fabrication throughput may be effectively promoted.

3. Because the protection wafer does not come in direct contact with the wafer holder, the possibility of generation of abnormal black powder on the wafer holder may be effectively reduced. Thus, the service life of the wafer holder can be effectively promoted.

4. Because the cooling gas is guided between the protection wafer and the wafer holder during the formation of the protection film, the cooling gas may lower the temperature of the protection film and thereby prevent the protection wafer from breaking due to overheat conditions.

5. The protection wafer may efficiently cover the supporting surface and the lateral surface of the wafer holder so that the possibility of the protection film forming on the wafer holder may be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of cleaning a reaction chamber, the reaction chamber having a wafer holder, the method comprising the following steps:
cleaning the reaction chamber using a cleaning gas; and
forming a protection film on an inner surface of the reaction chamber, wherein when forming the protection film, a plurality of supporting pins is disposed on the wafer holder and a protection wafer is provided on the supporting pins, so that the supporting pins create a gap between the protection wafer and the wafer holder for preventing the protection wafer from contacting the wafer holder at any point, and a cooling gas is guided between the protection wafer and the wafer holder simultaneously,
wherein when cleaning the reaction chamber, the supporting pins are not provided on the wafer holder.

2. The method of cleaning a reaction chamber according to claim 1, wherein the cooling gas is provided by the wafer holder.

3. The method of cleaning a reaction chamber according to claim 1, wherein the cooling gas comprises helium gas.

4. The method of cleaning a reaction chamber according to claim 1, wherein the wafer holder comprises an electrostatic chuck.

5. The method of cleaning a reaction chamber according to claim 1, wherein a material of the wafer holder comprises ceramic material.

6. The method of cleaning a reaction chamber according to claim 1, wherein a material of the protection wafer comprises ceramic material.

7. The method of cleaning a reaction chamber according to claim 1, wherein the protection wafer comprises a first covering body for covering a supporting surface of the wafer holder.

8. The method of cleaning a reaction chamber according to claim 7, wherein the first covering body comprises a circular plate.

9. The method of cleaning a reaction chamber according to claim 7, wherein the protection wafer further comprises a second covering body connected to a periphery of the first covering body for covering a lateral surface connected to the periphery of the supporting surface.

10. The method of cleaning a reaction chamber according to claim 9, wherein the second covering body comprises a ring-shape side wall.

11. The method of cleaning a reaction chamber according to claim 1, wherein a material of the protection film comprises oxide.

12. The method of cleaning a reaction chamber according to claim 1, wherein the step of forming the protection film comprises performing a chemical vapor deposition process.

13. The method of cleaning a reaction chamber according to claim 1, wherein the cleaning gas comprises $NF_3$ gas.

14. The method of cleaning a reaction chamber according to claim 1, wherein the reaction chamber comprises a chemical vapor deposition chamber.

15. The method of cleaning a reaction chamber according to claim 1, wherein the reaction chamber comprises a dry etching chamber.

* * * * *